US010210285B2

(12) United States Patent
Wong et al.

(10) Patent No.: US 10,210,285 B2
(45) Date of Patent: Feb. 19, 2019

(54) METHODS FOR GENERATING A FLOOR PLAN FROM A BUILDING SCAN

(71) Applicant: INDOOR REALITY INC., Berkeley, CA (US)

(72) Inventors: James Wong, Union City, CA (US); Avideh Zakhor, Berkeley, CA (US)

(73) Assignee: INDOOR REALITY INC., Berkeley, CA (US)

( * ) Notice: Subject to any disclaimer, the term of this patent is extended or adjusted under 35 U.S.C. 154(b) by 108 days.

(21) Appl. No.: 15/232,903

(22) Filed: Aug. 10, 2016

(65) Prior Publication Data

US 2018/0046733 A1    Feb. 15, 2018

(51) Int. Cl.
*G06F 17/50* (2006.01)
*G06T 17/00* (2006.01)
*G06T 17/20* (2006.01)

(52) U.S. Cl.
CPC .......... *G06F 17/5004* (2013.01); *G06T 17/00* (2013.01); *G06T 17/20* (2013.01); *G06T 2210/04* (2013.01)

(58) Field of Classification Search
None
See application file for complete search history.

(56) References Cited

U.S. PATENT DOCUMENTS

| 2009/0043504 A1* | 2/2009 | Bandyopadhyay | G01C 17/38 701/469 |
| 2013/0346020 A1* | 12/2013 | Pershing | G06Q 10/06 702/156 |
| 2016/0055268 A1* | 2/2016 | Bell | G06F 17/5004 703/1 |

OTHER PUBLICATIONS

Turner, Eric et al., "Floor Plan Generation and Room Labeling of Indoor Environments from Laser Range Data", Jan. 5-8, 2014, International Conference on Computer Graphics Theory and Applications (GRAPP), IEEE. (Year: 2014).*
Turner, Eric et al., "Watertight As-Built Architectural Floor Plans Generated from Laser Range Data", 2012, Second Joint 3DIM/3DPVT Conference: 3D Imaging, Modeling, Processing, Visualization and Transmission, IEEE. (Year: 2012).*
Blaer, Paul S. et al. ,"View Planning and Automated Data Acquisition for Three-Dimensional Modeling of Complex Sites", Jul. 30, 2009, Journal of Field Robotics 26, Wiley Periodicals, Inc. (Year: 2009).*
CoSTARS Note #6: Doubles, Booleans, and Chars (and Other Primitives, too!), Retrieved on Aug. 30, 2018. (Year: 2018).*

* cited by examiner

*Primary Examiner* — Cedric Johnson
(74) *Attorney, Agent, or Firm* — Kali Law Group, P.C.

(57) ABSTRACT

Methods for generating a floor plan from a building scan of a building using an electronic computing device are presented, the method including: causing the electronic computing device to receive the building scan; converting the building scan to a floor plan; and refining the floor plan to approximate the building. In some embodiments, the causing the electronic computing device to receive the building scan further includes: extracting information from an input file to obtain a representation of a number of rooms and walls corresponding with the building scan, where the information is selected from the group consisting of: a set of vertices, a set of triangles, and a set of rooms.

18 Claims, 8 Drawing Sheets

(STEP 212)

(STEP 214)

METHODS FOR GENERATING A FLOOR PLAN FROM A BUILDING SCAN

BACKGROUND

Computerized 3D modeling for building architecture has become the de facto standard for designing, construction, operating, maintaining, and remodeling of buildings. For new construction, 3D digital Computer Aided Design (CAD) drawings are readily available. For older buildings however, 3D architectural models either are missing, or are not up to date due to multiple remodeling and changes that have not been documented over the years. In these situations, it is important to first recover the 3D architectural model of the building before any remodeling or retrofit is carried out. This is referred to as "as built" floor plan recovery and can be done in multiple ways. One way is to use tape measure or laser pointer devices to manually measure dimensions in a building to recreate the architectural floor plan manually. Another is to use laser range finders, either static or mobile, to scan the buildings in order to create a 3D point cloud, which can then be used in a manual, laborious, and tedious step to create the 2D or 3D digital floor plan of the building. It may be useful to provide a method for converting a building scan to an electronic 2D or 3D floor plan that may be editable using 3D or 2D design tools. As such, methods for generating a floor plan from a building scan are presented herein.

BRIEF SUMMARY

The following presents a simplified summary of some embodiments of the invention in order to provide a basic understanding of the invention. This summary is not an extensive overview of the invention. It is not intended to identify key/critical elements of the invention or to delineate the scope of the invention. Its sole purpose is to present some embodiments of the invention in a simplified form as a prelude to the more detailed description that is presented below.

As such, methods for generating a building scan of a building using an electronic computing device are presented, the method including: causing the electronic computing device to receive the building scan; converting the building scan to a floor plan; and refining the floor plan to approximate the building. In some embodiments, the causing the electronic computing device to receive the building scan further includes: extracting information from an input file to obtain a representation of a number of rooms and walls corresponding with the building scan, where the information is selected from the group consisting of: a set of vertices, a set of triangles, and a set of rooms. In some embodiments, the converting the building scan to a floor plan further includes: computing a principal axis for the building scan; straightening the walls represented by the building scan; removing intersections of rooms represented by the building scan; shrinking the rooms by an offset; collecting edges from each of the rooms; generating a Voronoi diagram from the edges; and extracting and joining edges from the Voronoi diagram. In some embodiments, straightening a number of walls represented by the building scan further includes: applying a Ramer-Douglas-Peucker (RDP) algorithm to straighten regions of the number of walls by fitting a simplified curve to an original curve of the building scan. In some embodiments, removing intersections of a number of rooms represented by the building scan further includes: arbitrarily selecting one of two intersecting rooms and subtracting an intersecting region of the two intersecting rooms from the selected one. In some embodiments, extracting and joining edges from the Voronoi diagram further includes: removing all tail edges from the Voronoi diagram, where the tail edges are all edges not parallel with at least one of the walls, and the edge is defined as the tail edge if and only if, a) one of vertices of the edge is a vertex to at most one additional edge vertex, or b) a midpoint of the edge lies within one of the rooms. In some embodiments, refining the floor plan to approximate the building further includes: parallelizing the number of edges such that all resulting edges are either parallel to or perpendicular to the principal axis. In some embodiments, parallelizing the number of edges such that all resulting edges are either parallel to or perpendicular to the principal axis further includes: with respect to the principal axis, selecting a misaligned edge that is misaligned with the principal axis; intersecting the misaligned edge with the perpendicular axis; cutting the misaligned edge into two edges; forcing the two edges to be parallel with the principal axis; and reconnecting the two edges, and with respect to the perpendicular axis, selecting the misaligned edge that is misaligned with the perpendicular axis; intersecting the misaligned edge with the principal axis; cutting the misaligned edge into two edges; forcing the two edges to be parallel with the perpendicular axis; and reconnecting the two edges. In some embodiments, refining the floor plan to approximate the building further includes: approximating at least one additional user-specified angle for the number of edges.

In other embodiments computing device program products for generating a floor plan from a building scan of a building using a computing device are presented, the computing device program products including: a non-transitory computer readable medium; first programmatic instructions for causing the electronic computing device to receive the building scan; second programmatic instructions for converting the building scan to a floor plan; and third programmatic instructions for refining the floor plan to approximate the building.

In other embodiments, methods for generating a floor plan from a building scan of a building using an electronic computing device are presented, the methods including: causing the electronic computing device to receive the building scan; converting the building scan to a floor plan, where the converting includes, computing a principal axis for the building scan, straightening a number of walls represented by the building scan, removing intersections of a number of rooms represented by the building scan; shrinking the number of rooms by an offset, collecting a number of edges from each of the number of rooms, generating a Voronoi diagram from the number of edges, and extracting and joining edges from the Voronoi diagram; and refining the floor plan to approximate the building, where the refining includes, parallelizing the number of edges such that all resulting edges are either parallel to or perpendicular to the principal axis, and approximating at least one additional user-specified angle for the number of edges.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
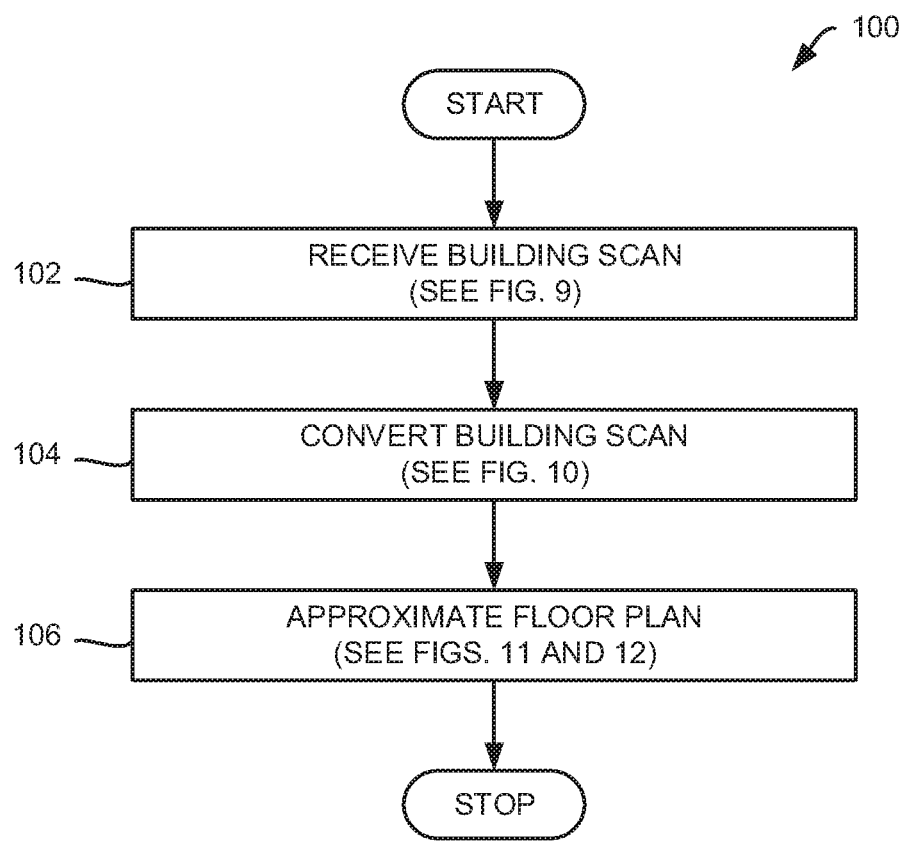
FIG. 1 is an illustrative flowchart of an overview of methods for generating a floor plan from a building scan of a building in accordance with embodiments of the present invention.

As will be appreciated by one skilled in the art, the present invention may be a system, a method, and/or a computer program product. The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing.

A computer readable storage medium, as used herein, is not to be construed as being transitory signals/per se/, such as radio waves or other freely propagating electromagnetic waves, electromagnetic waves propagating through a waveguide or other transmission media (e.g., light pulses passing through a fiber-optic cable), or electrical signals transmitted through a wire. Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks. The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 9:
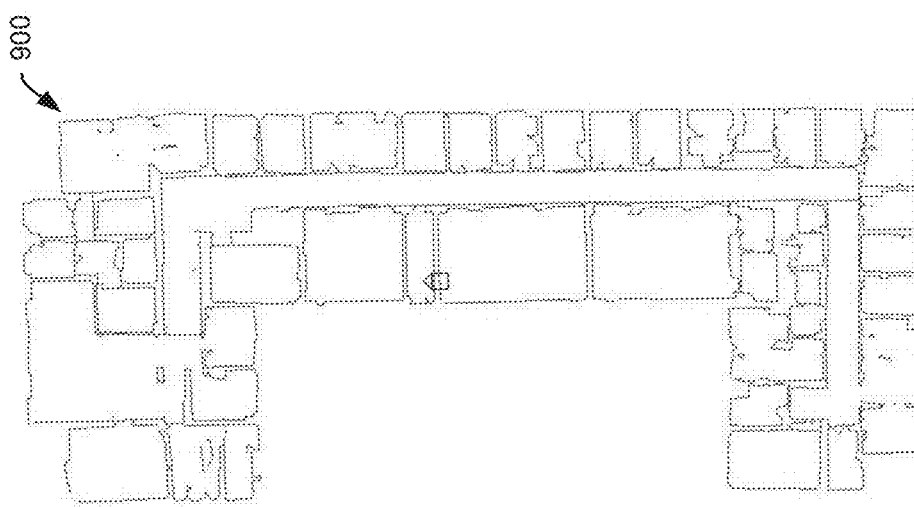
FIG. 9 is an illustrative representation of a prior art building scan in accordance with embodiments of the present invention.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks FIG. 1 is an illustrative flowchart 100 of an overview of methods for generating a floor plan from a building scan of a building in accordance with embodiments of the present invention. As such, at a first step 102, the method receives a building scan. An example of a building scan may be found at FIG. 9, which is an illustrative representation of a prior art building scan 900 in accordance with embodiments of the present invention. Examples of building scans suitable for input into methods disclosed herein may be found in U.S. patent application Ser. No. 14/947,869 entitled, "METHODS FOR INDOOR 3D SURFACE RECONSTRUCTION AND 2D FLOOR PLAN RECOVERY UTILIZING SEGMENTATION OF BUILDING AND OBJECT ELEMENTS," which is incorporated herein by reference. Upon receiving a building scan, methods extract information from an input file to obtain a representation of rooms and walls corresponding with the building scan. At least some of the information required for utilizing embodiments herein may be: sets of vertices that may each be represented as two doubles; sets of triangles that may each be represented as three doubles; and sets of rooms that may each be represented as a subset of triangles.

Figure 10:
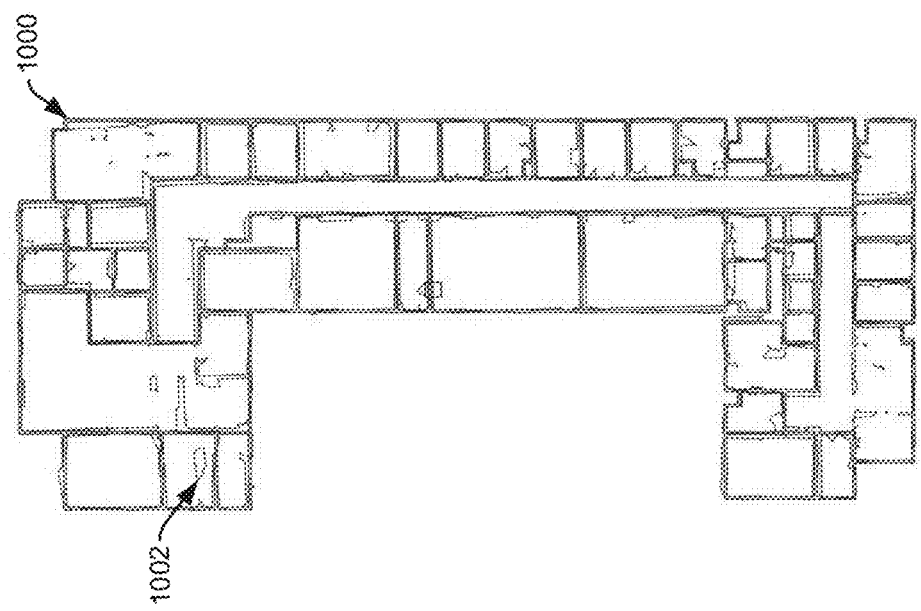
FIG. 10 is an illustrative representation of a floor plan overlaid with a building scan in accordance with embodiments of the present invention.
Figure 13:
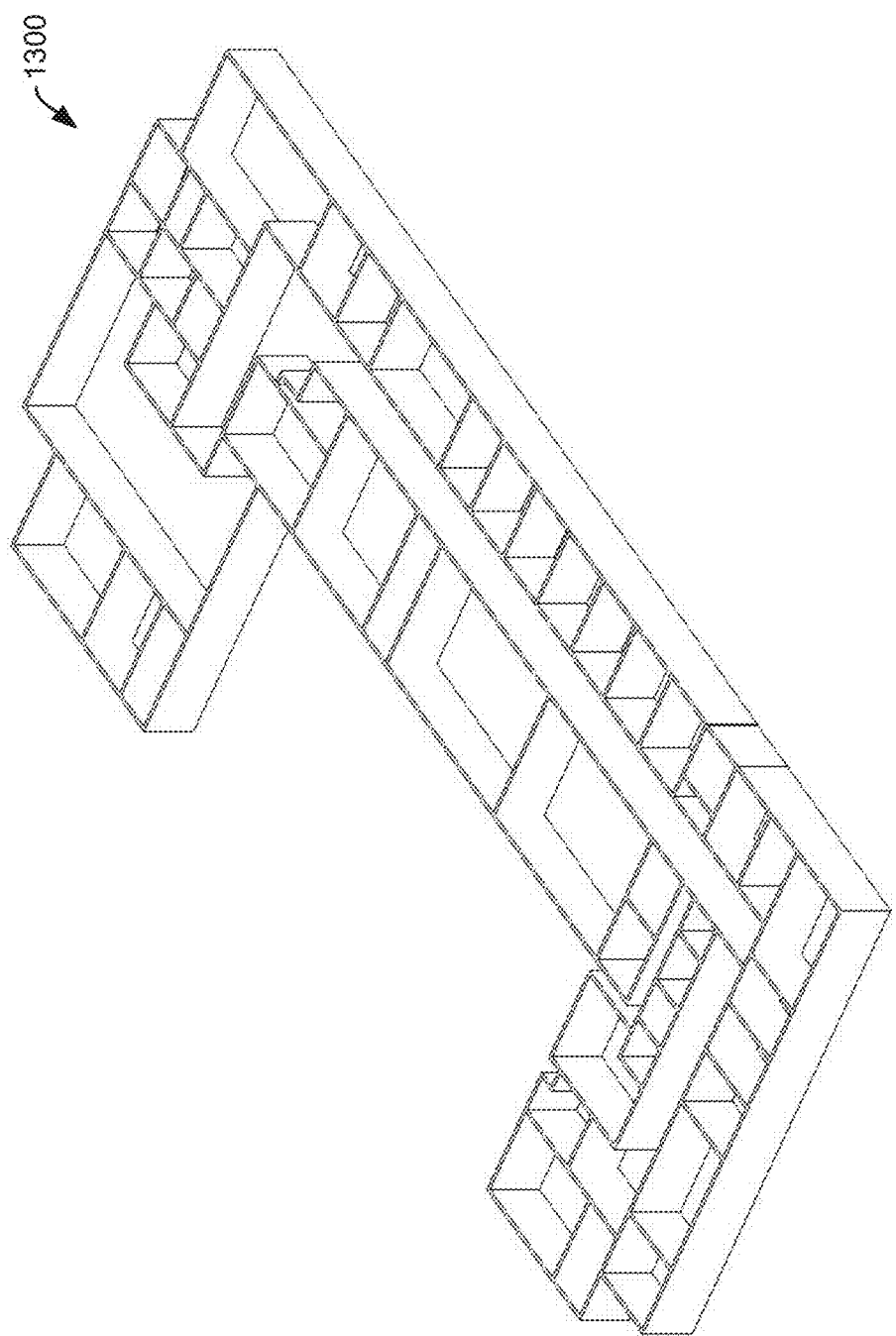
FIG. 13 is an illustrative representation of 3D model derived from a floor plan approximation in accordance with embodiments of the present invention.

At a next step 104, the method converts the building scan to a floor plan. An example of such a floor plan may be found at FIG. 10, which is an illustrative representation of a floor plan 1000 overlaid with a building scan 1002 in accordance with embodiments of the present invention. By converting a floor plan utilizing methods provided herein, a floor plan may allow, in some examples, the creation of a 3D model such as illustrated in FIG. 13 which is an illustrative representation of 3D model 1300 derived from a floor plan in accordance with embodiments of the present invention. A step 104 will be discussed in further detail below for FIG. 2.

Figure 12:
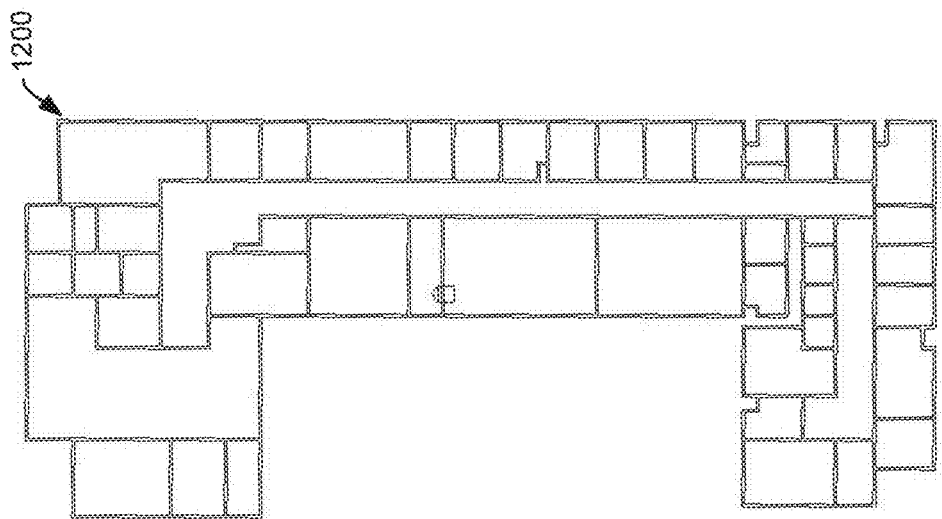
FIG. 12 is an illustrative representation of a refined floor plan approximation in accordance with embodiments of the present invention.
Figure 11:
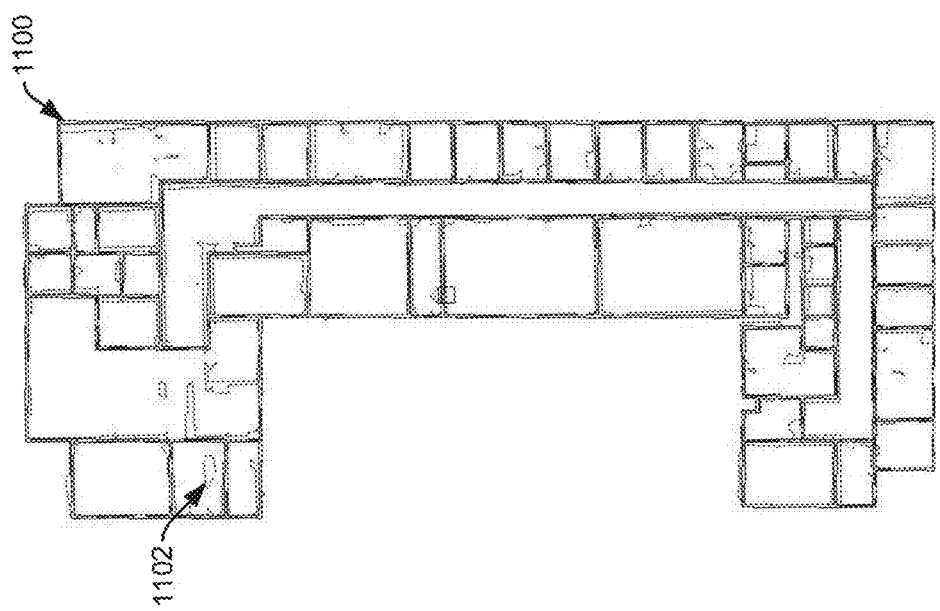
FIG. 11 is an illustrative representation of a refined floor plan approximation overlaid with a building scan in accordance with embodiments of the present invention.

At a next step 106, the method refines the floor plan. An example of a refined floor plan may be found at FIGS. 11 and 12. FIG. 11 is an illustrative representation of a refined floor plan approximation 1100 overlaid with a building scan 1102 and FIG. 12 is an illustrative representation of a refined floor plan approximation 1200 without an overlaid building scan 1102 of FIG. 11 in accordance with embodiments of the present invention. A step 106 will be discussed in further detail below for FIG. 3. The method then ends.

Figure 2:
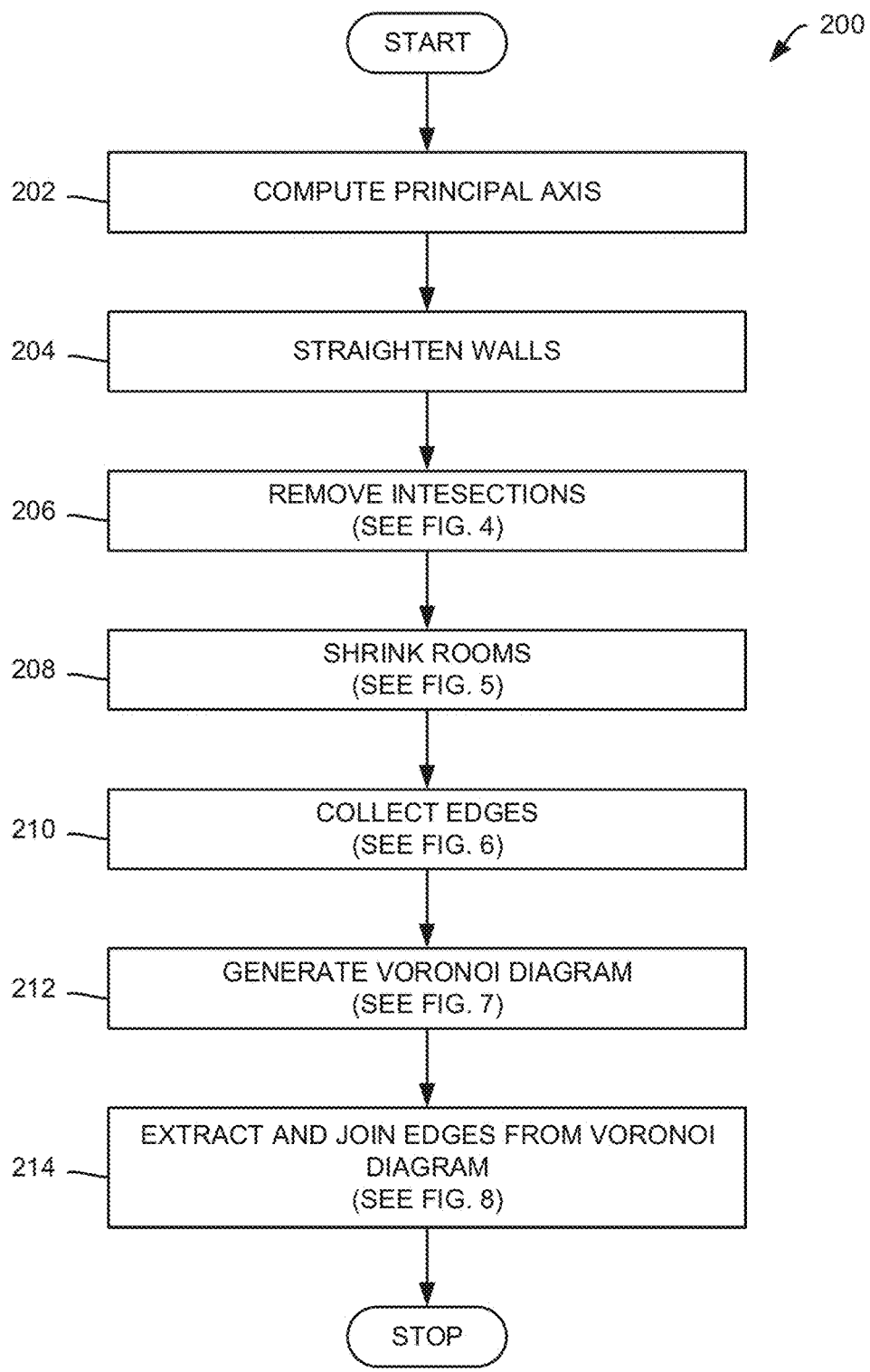
FIG. 2 is an illustrative flowchart of methods for converting a building scan in accordance with embodiments of the present invention.

FIG. 2 is an illustrative flowchart 200 of methods for converting a building scan in accordance with embodiments of the present invention. In particular, flowchart 200 is further illustrative of a step 104 (FIG. 1). As such, at a step 202, the method computes a principal axis for the building scan. Methods disclosed herein assume that walls are placed orthogonally with respect to one another. Thus, in computing a principal axis, all walls must either be parallel or perpendicular to the principal axis. A best approximation for a principal axis may be computed by binning each scanned edge based on its angle with a horizontal reference; selecting a bin having a largest sum of edge length; and setting the principal axis to equal an average angle of the scanned edges in the selected bin. Once a principal axis is computed, a perpendicular axis may then be computed that is equal to the principal axis plus 90 degrees. At a next step 204, the method straightens the walls represented by the building scan by applying a Ramer-Douglas-Peucker (RDP) algorithm to straighten regions of the walls by fitting a simplified curve to the original curve of the building scan. This step has the effect of removing noise from the building scan and generating straight line segments to represent the walls of the floor plan. In operation, RDP takes a curve composed of line segments and fits a simplified curve. The simplified curve contains a subset of the vertices that define the original curve. The accuracy of an RDP approximation may be user-specified. In methods disclosed herein RDP may be applied to a loop of wall segments defining a room. The resulting line segments may be referred to as "edges."

Figure 4:
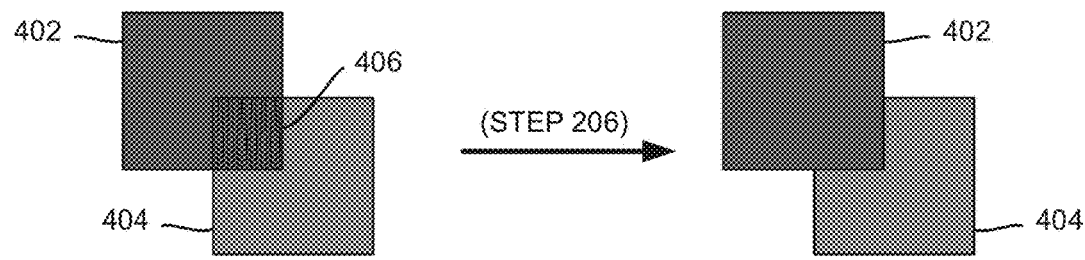
FIG. 4 is an illustrative representation of a step for removing intersections in accordance with embodiments of the present invention.
Figure 5:
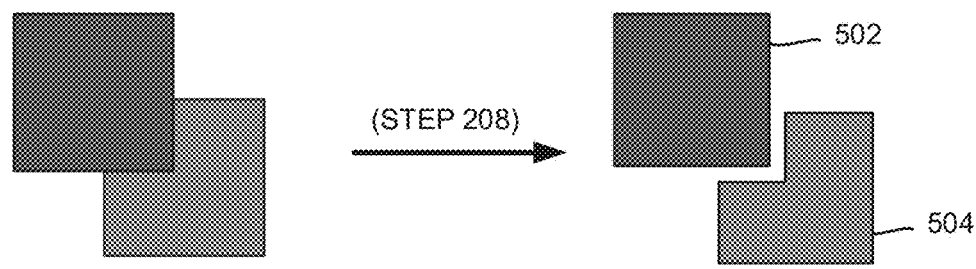
FIG. 5 is an illustrative representation of a step for shrinking rooms in accordance with embodiments of the present invention.

At a next step 206, the method removes intersections of rooms created by the application of the RDP algorithm. An example of a step 206 may be found at FIG. 4, which is an illustrative representation of a step for removing intersections in accordance with embodiments of the present invention. Because a Voronoi diagram will be generated at a later step, all overlaps should be removed. In operation, an intersection may be removed by arbitrarily selecting one room of two intersecting rooms and subtracting the intersecting region of the two intersecting rooms from the selected room. As illustrated in FIG. 4, rooms 402 and 404 overlap at intersection 406. After a step 206, intersection 406 has been subtracted from room 404. Methods might equally subtract intersection 406 from room 402 without limitation. At a next step 208, the method shrinks the rooms. An example of a step 208 may be found at FIG. 5, which is an illustrative representation of a step for shrinking rooms 502 and 504 in accordance with embodiments of the present invention. In order to generate a meaningful Voronoi diagram, some gap must exist to separate all rooms from one another. The size of the gap may be user-specified without limitation.

Figure 6:
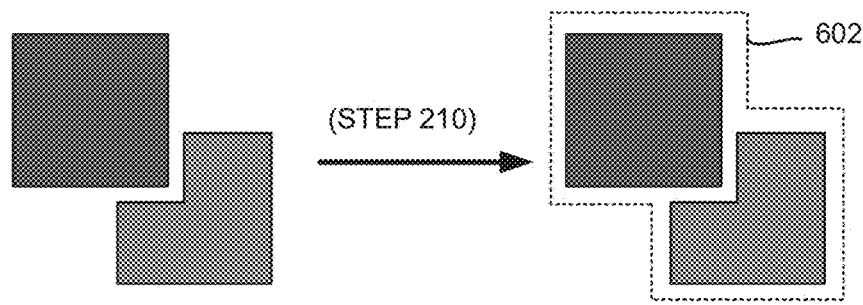
FIG. 6 is an illustrative representation of a step for computing an external contour in accordance with embodiments of the present invention.
Figure 7:
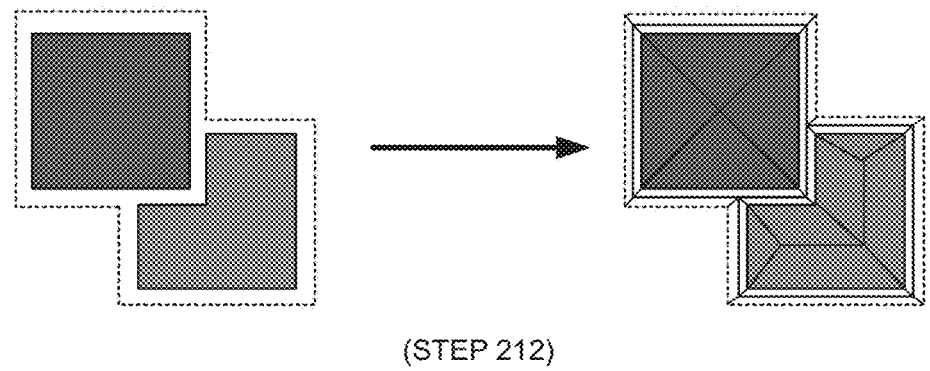
FIG. 7 is an illustrative representation of a step for generating a Voronoi diagram in accordance with embodiments of the present invention.
Figure 7:
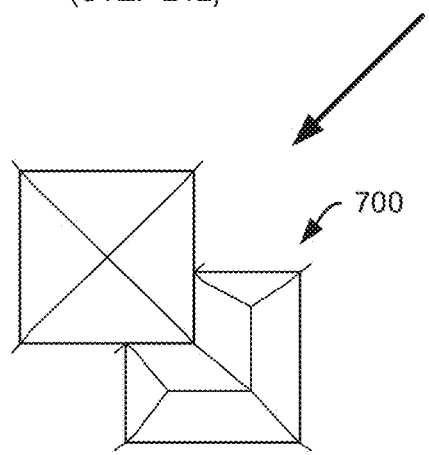
Figure 8:
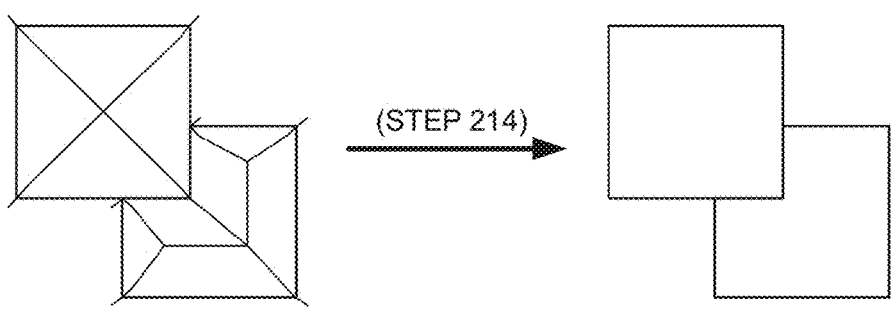
FIG. 8 is an illustrative representation of steps for extracting and joining edges in accordance with embodiments of the present invention.

At a next step 210, the method collects edges. In order to collect edges, the method computes an external contour that surrounds the plurality of rooms with a contour offset. An example of a step 210 may be found at FIG. 6, which is an illustrative representation of a step for computing an external contour 602 in accordance with embodiments of the present invention. Once the external contour is computed, all edges may be collected for each room along with the edges of the external contour and utilized to generate a Voronoi diagram. Thus, at a next step 212, the method generates a Voronoi diagram. A Voronoi diagram is a partitioning of a plane into regions based on distance to points in a specific subset of the plane. An example of a step 212 may be found at FIG. 7, which is an illustrative representation of a step for generating a Voronoi diagram 700 in accordance with embodiments of the present invention. Once the Voronoi diagram is generated, the method proceeds to a step 214 to extract and join edges from the Voronoi diagram. This step may be accomplished first by removing all tail edges from the Voronoi diagram. As utilized herein, tail edges are all edges that are not parallel to a wall. Furthermore, an edge is a tail edge if and only if, a) one of the plurality of vertices of the edge is a vertex to at most one additional edge vertex, or b) a midpoint of the edge lies within one of the plurality of rooms. After removing tail edges, sets of edges may be grouped as loops that form a room. An example of a step 214 may be found at FIG. 8, which is an illustrative representation of steps for extracting and joining edges in accordance with embodiments of the present invention.

Figure 3:
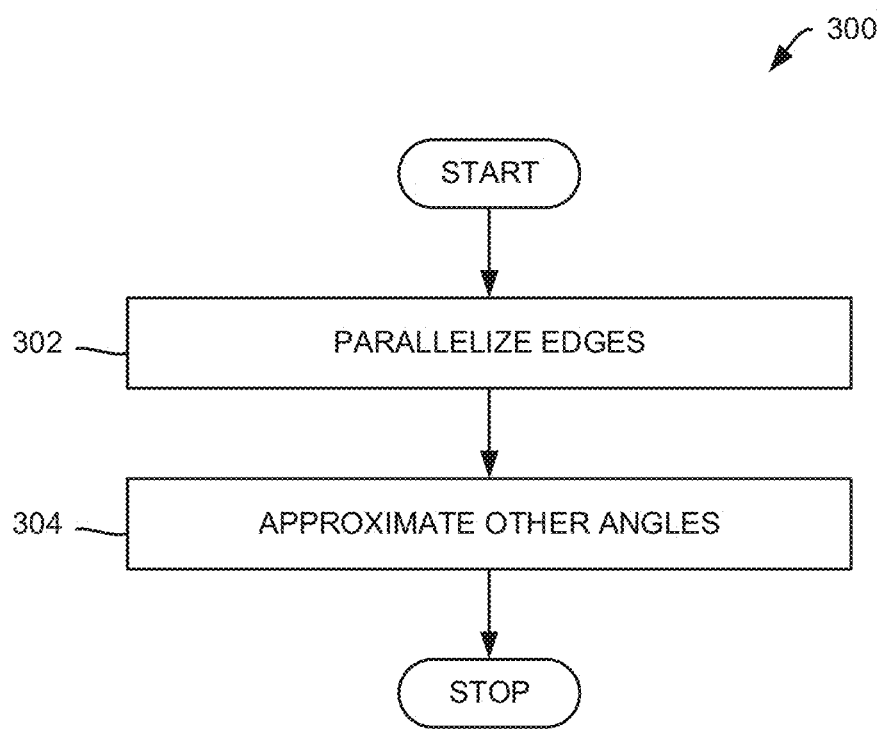
FIG. 3 is an illustrative flowchart of methods for refining a floor plan in accordance with embodiments of the present invention.

FIG. 3 is an illustrative flowchart 300 of methods for refining a floor plan in accordance with embodiments of the present invention. In particular, flowchart 300 is further illustrative of a step 106 (FIG. 1). At a first step 302, the method parallelizes all edges such that all resulting edges are either parallel to or perpendicular to the principal axis. By parallelizing all edges, angled line segments, which may represent noise or some other artifact, may be removed. To parallelize edges to the principal axis, the method may: select a misaligned edge that is misaligned with the principal axis; intersect the misaligned edge with the perpendicular axis; cut the misaligned edge into two edges; force the two edges to be parallel with the principal axis; and reconnect the two edges. In some embodiments, the misaligned edge may be intersected at a midpoint or a weighted midpoint. To parallelize edges to the perpendicular axis, the method may: select the misaligned edge that is misaligned with the perpendicular axis; intersect the misaligned edge with the principal axis; cut the misaligned edge into two edges; force the two edges to be parallel with the perpendicular axis; and reconnect the two edges. As before, in some embodiments, the misaligned edge may be intersected at a midpoint or a weighted midpoint.

At a next step 304, the method approximates at least one additional user-specified angle for all edges. If a user employing methods disclosed herein selects the allowable angles to be 90 degrees, then this step is moot as the default methods result in 90 degree aligned walls. However, in other embodiments, a user may specify any angle such as, all, 15, 30, 45, etc. without limitation. For example, when a "staircase" of edges should form a straight line and has significant offset from the building scan, the staircase edges may be replaced with a straight-line approximation that satisfies the user-specified degree of approximation.

The terms "certain embodiments", "an embodiment", "embodiment", "embodiments", "the embodiment", "the embodiments", "one or more embodiments", "some embodiments", and "one embodiment" mean one or more (but not all) embodiments unless expressly specified otherwise. The terms "including", "comprising", "having" and variations thereof mean "including but not limited to", unless expressly specified otherwise. The enumerated listing of items does not imply that any or all of the items are mutually exclusive, unless expressly specified otherwise. The terms "a", "an" and "the" mean "one or more", unless expressly specified otherwise.

While this invention has been described in terms of several embodiments, there are alterations, permutations, and equivalents, which fall within the scope of this invention. It should also be noted that there are many alternative ways of implementing the methods, computer program products, and apparatuses of the present invention. Furthermore, unless explicitly stated, any method embodiments described herein are not constrained to a particular order or sequence. Further, the Abstract is provided herein for convenience and should not be employed to construe or limit the overall invention, which is expressed in the claims. It is therefore intended that the following appended claims be interpreted as including all such alterations, permutations, and equivalents as fall within the true spirit and scope of the present invention.

What is claimed is:

1. A method for generating a floor plan from a building scan of a building using an electronic computing device, the method comprising:
   causing the electronic computing device to receive the building scan;
   converting the building scan to the floor plan wherein the converting the building scan to the floor plan comprises:
      computing a principal axis for the building scan;
      straightening a plurality of walls represented by the building scan;
      removing intersections of a plurality of rooms represented by the building scan;
      shrinking the plurality of rooms by an offset;
      collecting a plurality of edges from each of the plurality of rooms;
      generating a Voronoi diagram from the plurality of edges; and
      extracting and joining edges from the Voronoi diagram; and
   refining the floor plan to approximate the building.

2. The method of claim 1, wherein the causing the electronic computing device to receive the building scan further comprises:
   extracting information from an input file to obtain a representation of a plurality of rooms and walls corresponding with the building scan, wherein the information is selected from the group consisting of: a set of vertices, a set of triangles, and a set of rooms.

3. The method of claim 2, wherein:
   the set of vertices are each represented as two doubles, wherein the set of triangles are each represented as three doubles, and wherein the set of rooms are each represented as a subset of triangles.

4. The method of claim 1, wherein the computing a principal axis for the building scan further comprises:
- binning each scanned edge based on its angle with a horizontal reference;
- selecting a bin having a largest sum of edge length; and
- setting the principal axis to equal an average angle of the scanned edges in the selected bin.

5. The method of claim 4, further comprising:
- setting a perpendicular axis equal to the principal axis plus 90 degrees.

6. The method of claim 1, wherein the straightening a plurality of walls represented by the building scan further comprises:
- applying a Ramer-Douglas-Peucker (RDP) algorithm to straighten regions of the plurality of walls by fitting a simplified curve to an original curve of the building scan.

7. The method of claim 1, wherein the removing intersections of a plurality of rooms represented by the building scan further comprises:
- arbitrarily selecting one of two intersecting rooms and subtracting an intersecting region of the two intersecting rooms from the selected one.

8. The method of claim 1, wherein the collecting a plurality of edges from each of the plurality of rooms further comprises:
- computing an external contour that surrounds the plurality of rooms with a contour offset.

9. The method of claim 1, wherein the extracting and joining edges from the Voronoi diagram further comprises:
- removing all tail edges from the Voronoi diagram, wherein the tail edges are all edges not parallel with at least one of the plurality of walls, and the edge is defined as the tail edge if and only if,
  - a) one of the plurality of vertices of the edge is a vertex to at most one additional edge vertex, or
  - b) a midpoint of the edge lies within one of the plurality of rooms.

10. The method of claim 1, wherein the refining the floor plan to approximate the building further comprises:
- parallelizing the plurality of edges such that all resulting edges are either parallel to or perpendicular to the principal axis.

11. The method of claim 10, wherein the parallelizing the plurality of edges such that all resulting edges are either parallel to or perpendicular to the principal axis further comprises:
- with respect to the principal axis,
  - selecting a misaligned edge that is misaligned with the principal axis;
  - intersecting the misaligned edge with the perpendicular axis;
  - cutting the misaligned edge into two edges;
  - forcing the two edges to be parallel with the principal axis; and
  - reconnecting the two edges, and
- with respect to the perpendicular axis,
  - selecting the misaligned edge that is misaligned with the perpendicular axis;
  - intersecting the misaligned edge with the principal axis;
  - cutting the misaligned edge into two edges;
  - forcing the two edges to be parallel with the perpendicular axis; and
  - reconnecting the two edges.

12. The method of claim 10, wherein the refining the floor plan to approximate the building further comprises:
- approximating at least one additional user-specified angle for the plurality of edges.

13. A computing device program product for generating a floor plan from a building scan of a building using a computing device, the computing device program product comprising:
- a non-transitory computer readable medium;
- first programmatic instructions for causing the electronic computing device to receive the building scan;
- second programmatic instructions for converting the building scan to a floor plan wherein the second programmatic instructions for converting the building scan to a floor plan comprises:
  - fifth programmatic instructions for computing a principal axis for the building scan;
  - sixth programmatic instructions for straightening a plurality of walls represented by the building scan;
  - seventh programmatic instructions for removing intersections of a plurality of rooms represented by the building scan;
  - eighth programmatic instructions for shrinking the plurality of rooms by an offset;
  - ninth programmatic instructions for collecting a plurality of edges from each of the plurality of rooms;
  - tenth programmatic instructions for generating a Voronoi diagram from the plurality of edges; and
  - eleventh programmatic instructions for extracting and joining edges from the Voronoi diagram; and
- third programmatic instructions for refining the floor plan to approximate the building.

14. The computing device program product of claim 13, wherein the first programmatic instructions for causing the electronic computing device to receive the building scan further comprises:
- fourth programmatic instructions for extracting information from an input file to obtain a representation of a plurality of rooms and walls corresponding with the building scan, wherein the information is selected from the group consisting of: a set of vertices, a set of triangles, and a set of rooms.

15. The computing device program product of claim 13, wherein the fifth programmatic instructions for computing a principal axis for the building scan further comprises:
- twelfth programmatic instructions for binning each scanned edge based on its angle with a horizontal reference;
- thirteenth programmatic instructions for selecting a bin having a largest sum of edge length; and
- fourteenth programmatic instructions for setting the principal axis to equal an average angle of the scanned edges in the selected bin.

16. The computing device program product of claim 13, wherein the eleventh programmatic instructions for extracting and joining edges from the Voronoi diagram further comprises:
- fifteenth programmatic instructions for removing all tail edges from the Voronoi diagram, wherein the tail edges are all edges not parallel with at least one of the plurality of walls, and the edge is defined as the tail edge if and only if,
  - a) one of the plurality of vertices of the edge is a vertex to at most one additional edge vertex, or
  - b) a midpoint of the edge lies within one of the plurality of rooms.

17. The computing device program product of claim 13, wherein the third programmatic instructions for refining the floor plan to approximate the building further comprises:
sixteenth programmatic instructions for parallelizing the plurality of edges such that all resulting edges are either parallel to or perpendicular to the principal axis; and
seventeenth programmatic instructions for approximating at least one additional user-specified angle for the plurality of edges.

18. A method for generating a floor plan from a building scan of a building using an electronic computing device, the method comprising:
causing the electronic computing device to receive the building scan;
converting the building scan to a floor plan, wherein the converting comprises:
computing a principal axis for the building scan,
straightening a plurality of walls represented by the building scan,
removing intersections of a plurality of rooms represented by the building scan;
shrinking the plurality of rooms by an offset,
collecting a plurality of edges from each of the plurality of rooms,
generating a Voronoi diagram from the plurality of edges, and
extracting and joining edges from the Voronoi diagram; and
refining the floor plan to approximate the building, wherein the refining comprises,
parallelizing the plurality of edges such that all resulting edges are either parallel to or perpendicular to the principal axis, and
approximating at least one additional user-specified angle for the plurality of edges.

* * * * *